(12) United States Patent
Dean et al.

(10) Patent No.: US 6,487,701 B1
(45) Date of Patent: Nov. 26, 2002

(54) SYSTEM AND METHOD FOR AC PERFORMANCE TUNING BY THERESHOLD VOLTAGE SHIFTING IN TUBBED SEMICONDUCTOR TECHNOLOGY

(75) Inventors: Alvar A. Dean, Groton, MA (US); Jerry D. Hayes, Milton, VT (US); Joseph A. Iadanza, Hinesburg, VT (US); Emory D. Keller, Jericho, VT (US); Sebastian T. Ventrone, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 76 days.

(21) Appl. No.: 09/711,744

(22) Filed: Nov. 13, 2000

(51) Int. Cl.[7] .............................................. G06F 17/50
(52) U.S. Cl. ................... 716/4; 716/5; 716/6
(58) Field of Search .................... 716/1–21; 363/74; 365/226, 227, 228, 229, 201

(56) References Cited

U.S. PATENT DOCUMENTS

| | | |
|---|---|---|
| 4,049,980 A | 9/1977 | Maitland |
| 4,229,667 A | 10/1980 | Heimbigner et al. |
| 4,263,519 A | 4/1981 | Schade, Jr. |
| 4,670,670 A | 6/1987 | Shoji |
| 4,695,745 A | 9/1987 | Mimoto et al. |
| 5,103,277 A | 4/1992 | Caviglia et al. |
| 5,397,934 A | 3/1995 | Merrill et al. |
| 5,612,645 A | 3/1997 | Halepete |
| 5,748,016 A | 5/1998 | Kurosawa |
| 5,753,958 A | 5/1998 | Burr et al. |
| 5,834,966 A | 11/1998 | So et al. |
| 5,892,260 A | 4/1999 | Okumura et al. |
| 5,898,618 A | 4/1999 | Lakkapragada et al. |
| 5,917,365 A | 6/1999 | Houston |
| 5,939,934 A | 8/1999 | So et al. |
| 5,943,246 A * | 8/1999 | Porter .................... 364/528.28 |
| 6,215,348 B1 * | 4/2001 | Steensgaard-Madsen .... 327/390 |
| 6,301,133 B1 * | 10/2001 | Cuadra et al. ................. 363/65 |
| 6,301,168 B1 * | 10/2001 | Crocker ....................... 365/201 |
| 6,342,816 B1 * | 1/2002 | Gradzki ....................... 330/331 |

OTHER PUBLICATIONS

Wunderlich et al, "A Linear Operational Transconductance Amplifier With Automatic Offset Cancellation and Transconductance Calibration," IEEE, Sep. 1999, pp. 1321–1324.*

Suetake et al, "Precise Physical Modeling of the Reverse–Short–Channel Effect for Circuit Simulation," IEEE, Sep. 1999, pp. 207–210.*

Jesper Streensgaard, "Bootstrapped Low–Voltage Analog Switches," IEEE, Jun. 1999, pp. ii–29–ii–32.*

Esseni et al, "Flexible Hot–Electron Programming of Flash Memories," IEEE, 1998, pp. 36.6.1–36.6.4.*

* cited by examiner

Primary Examiner—Vuthe Siek
(74) Attorney, Agent, or Firm—DeLio & Peterson LLC; Robert Curcio; Robert A. Walsh

(57) ABSTRACT

A system and method are described for separating the bulk connections for FETs on a semiconductor wafer from the supply rails, testing the wafer to determine if a shift in the threshold voltage, $V_T$, of certain devices within the wafer, as defined by the bulk-wells, can remove an AC defect in the IC circuit, and tailoring the voltage or voltages applied to the bulk nodes, post-manufacture, such that the integrated circuit meets its performance targets or is sorted to a more valuable performance level. The method requires generating a gate level netlist of the IC's circuitry and performing timing calculations on these circuit netlists using static timing analyses, functional delay simulations, circuit activity analyses, and functional performance testing. The failures are then correlated to respective IC circuits, worst case slack circuits are investigated, and proposed changes to the threshold voltages are employed in the hardware.

39 Claims, 4 Drawing Sheets

SYSTEM AND METHOD FOR AC PERFORMANCE TUNING BY THERESHOLD VOLTAGE SHIFTING IN TUBBED SEMICONDUCTOR TECHNOLOGY

BACKGROUND OF THE INVENTION

1. Field of the Invention

This invention relates generally to integrated circuit chips, and more particularly to a system and automated methodology for ac performance tuning of tubbed semiconductor ASIC chips in a timing-safe environment by repairing detected AC defects in the semiconductor die.

2. Description of Related Art

As the performance targets for integrated circuits increase, the presence of AC defects within the manufactured device is of greater concern due to test cost and yield impacts. While present test methodologies test for AC defects, products failing these tests are discarded or sorted into less-profitable speed bins.

In order to improve the AC yield characteristics produced by IC devices, a system and method for tailoring device performance post-manufacture is disclosed. The means described allows for tailoring of the bulk voltage supplied to various well structures within the die, thereby altering the effective threshold voltage and AC performance of the devices present within the well, thus in effect, repairing detected AC defects.

The value of the threshold voltage of a transistor, $V_T$, particularly a MOS transistor, is determined in part by the fabrication process specifications, i.e., the channel length, channel width, doping, and the like. Thus, it is possible to set $V_T$ to a desired (predetermined) level during fabrication. It is difficult, however, to choose the VT such that the transistor will operate efficiently over a wide range of supply voltages. Additionally, manufacturing inconsistencies will also cause variations in the threshold voltage among individual transistors.

Several innovative techniques for controlling well bias have been previously disclosed, however, all lack a defined methodology for performing in-situ testing of semiconductors. Moreover, these prior art techniques have not been built around characterized technology circuit delay timing rules, which allow for safe tailoring of threshold voltages via well bias in order to speed up AC performance without introducing new timing problems such as undesired fast paths.

The bulk of today's semiconductor integrated circuits are designed using Metal-Oxide-Semiconductor-Field-Effect-Transistors (MOSFETs). Although in most designs, MOSFETs are treated as three-terminal devices where the conductivity between the source and the drain of the device is controlled by a gate voltage, MOSFETs are inherently four-terminal devices, in which a fourth terminal, the bulk node, affects the parametric characteristics of the device. The threshold voltage for a MOSFET, $V_T$, is the gate voltage at which conduction between the source and drain begins. This threshold voltage may be tailored by adjusting the bulk voltage, thereby altering the electric field impressed upon the MOSFET during normal operation. Early MOSFET products used p-FETs or n-FETs having differentiation between load and switching devices. These junctions were typically provided by implant tailoring during manufacture. All devices within the die shared a common bulk node with a voltage supplied coincident with the power supplies for the die. In later CMOS devices in which both n-FETs and p-FETs were integrated within the same die, tubs or wells of bulk material were used to house either the n-FET or p-FET. The bulk connections in these devices were generally tied to one of the voltage rails, or alternatively, for devices within a well or tub only, to a node within the operative circuit. Although in many cases, the base wafer upon which the FETs without tubs were produced was highly resistive, the isolation between FET regions was not sufficient for independent back biasing of device regions without wells. In each case, a voltage potential was provided which could not be altered in reference to the supply rails for the die.

In more advanced CMOS technologies, local isolation of both n-FETs and p-FETs within tubs has been achieved by the stacking of tub structures. As an example, n-FET devices fabricated on a p-type wafer may be isolated by first implanting an n-well within the wafer and subsequently creating a p-well within the larger n-well. In these cases, care is taken to bias the intervening tub appropriately to prevent semiconductor latch-up.

In silicon-on-insulator (SOI) technology, n-FETs and p-FETs are both isolated in the locale of device level tubs; however, shallow SOI technologies leave the body of the device floating.

Typical methods for adjusting threshold voltages in semiconductors include disconnecting each bulk region or well from its associated fixed rail voltage and alternatively making a connection to a set of devices acting as a potentiometer to adjust the bias voltage of the bulk region or well, independent of the fixed rail voltages. Each well can be connected to a dedicated potentiometer, or share a potentiometer with other wells on the die. Several embodiments of the bulk bias potentiometer have been realized.

In FIG. 1, the bulk connection 12 is made at the connection point between two series resistors R1, R2 bridging the $V_{CC}$ 5 to $V_{SS}$ 10 envelope. The resistors R1 and R2 are of an arbitrary size which considers power dissipation, accuracy, and predicted optimum bias voltage settings for the circuit, and are trimmable via laser or other types of fuse blow. AC testing is typically performed with nominal biasing of the stack. If a fail occurs, the voltage applied to the stack, $V_{CC}$ 5, is assumed separate from the main $V_{SS}$ supply 10 of the chip, and may be moved higher or lower. The test is repeated to determine a setting at which the AC test produces adequate yields. The empirically determined $V_{CC}$ value 5 is used with either the expected nominal values of the resistors, or the expected ratio of resistor R1 and resistor R2 coupled with an empirical resistor value. This is calculated by measuring the ground current of the stack at a known $V_{CC}$ to determine the bulk bias voltage needed for yield (the bias tap supplies a tub with back biased diodes which generally has very small leakage currents). The calculated voltage is then converted to a trim percentage necessary at either resistor R1 or resistor R2 to obtain the desired bias voltage given the operational $V_{CC}$ value for the silicon. Additional capability can be added by placing shunt devices in parallel with one or more of the resistors in the stack (R1 and R2 may consist of several segments) such that the well may be biased at the $V_{CC}$ rail. This capability also adds additional accuracy to resistor measurements which precede device trim calculations. The trimming accuracy and achievement of the desired AC effect is determined by measurement of $V_{SS}$ current at the specified voltage and by the AC test post trim.

Another method for adjusting threshold voltages in semiconductors is depicted in FIG. 2. This method involves removing the direct connection to $V_{SS}$ for the stack at the chip's edge 14 in favor of a supply voltage via a bandgap reference system 20. The reference system includes the generation of a $V_{CC}$ 5, a temperature independent reference voltage, and a voltage reference multiplier 18 which may be adjustable. The bandgap itself provides for reference equivalence between the test and functional environments with the voltage multiplier, allowing for biasing of well voltages $V_{sub}$ above voltages normally possible with a bandgap device. If a voltage multiplication is adjustable, this function takes the place of $V_{CC}$ shifting during test. In cases where variable multiplication is not provided, the $V_{SS}$ reference, being separate from common ground, is assumed to be isolated from other grounds on the die, and can be moved to simulate $V_{CC}$ shifting.

In U.S. Pat. No. 5,917,365 issued to Houston, entitled "OPTIMIZING THE OPERATING CHARACTERISTICS OF A CMOS INTEGRATED CIRCUIT," an n-channel transistor and a p-channel transistor each have a voltage bias applied to a common substrate. A control circuit is operated to apply the varying voltage bias to the common substrate in order to reduce the leakage current in the IC. The control circuit represents a function employed to deliver predetermined bias voltages depending upon two operational modes of the device, active mode and standby mode. However, there is no analytical mechanism for determining the appropriate bias voltage level and then reanalyzing at this new level for system performance during AC testing.

In U.S. Pat. No. 5,397,934 issued to Merrill, et al., entitled "APPARATUS AND METHOD FOR ADJUSTING THE THRESHOLD VOLTAGE OF MOS-TRANSISTORS," the effective threshold voltage of the MOS-transistor is adjusted by adjusting its source-body voltage potential. The method consists of measuring a first voltage signal, measuring the effective threshold voltage of the MOS-transistor, generating a second voltage signal, comparing the first voltage signal to the second voltage signal, and adjusting the effective threshold voltage of the MOS-transistor so that the second voltage signal is substantially equal to the first voltage signal. The threshold voltage adjusting apparatus, however, is represented solely by hard-wired circuitry with built-in feedback. There are no provisions to analytically determine the appropriate bias voltage threshold levels, recalculate their effectiveness, and then set the levels based on the results of the recalculations.

As indicated by the above-cited prior art, active bulk well voltage control is being used for leakage power control under idle conditions or under program control, in part to enhance product yields, but no methodology or technique currently exists for AC performance tailoring of portions of ASIC devices based on characterized design rule data. Specifically, active circuits are not directly targeted for appropriate and selective threshold voltage shifting.

The advantage of AC performance tailoring is that chips which fail AC tests or speed sorts, devices within the die, and more particularly, subsets of devices within the die, may have their performance incrementally adjusted via bulk bias adjustments in order to meet AC specifications or provide for higher performance sort yields. Ordinarily, such devices would either be scrapped as out-of-specification where performance sorting was not done, or sorted to slower performance sorts with lower profit margins where performance sorting was practiced.

Furthermore, this approach ensures that any modifications made to the hardware are still certified according to the device models via the new design rule data.

Bearing in mind the problems and deficiencies of the prior art, it is therefore an object of the present invention to establish a system and methodology for a set of AC performance tests that adjusts test failures through bulk bias voltage variations.

It is another object of the present invention to provide a system and methodology for identifying active circuits during each performance test, isolating failing circuits, and proposing threshold voltages based on this empirical data.

A further object of the invention is to provide a system and methodology for proposing and retesting different bulk well bias voltages on a semiconductor wafer.

Yet another object of the invention is to provide a system and method for tailoring the voltage or voltages applied to bulk nodes, post-manufacture, such that the integrated circuit under test meets its performance target.

It is another object of the present invention to target active IC circuitry for voltage threshold shifting.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method for reducing AC test failures during performance testing of an integrated circuit wafer having a plurality of gates, circuits, and bulk well voltages, the method comprising: analyzing each of the plurality of circuits against a plurality of performance verification test cases; identifying failed circuits that do not pass the plurality of performance verification test cases; calculating voltage threshold values for the failed circuits; performing a static timing analysis on the plurality of circuits, substituting the calculated voltage threshold values for the bulk well voltages; programming the integrated circuit wafer to operate at the calculated voltage threshold values that pass the static timing analysis; and, reanalyzing the plurality of circuits having programmed the calculated voltage threshold values against the plurality of performance verification tests.

This method may further comprise: generating a gate level netlist of the plurality of circuits; and, simulating the netlist on a functional delay simulator against a library of the performance verification test cases and technology circuit delay timing rules. The bulk well voltages are initially preconditioned using nominal bias values.

The nominal bias values are chosen such that there is a trade off between timing performance and power dissipation due to leakage currents. The static timing analysis comprises analyzing the gate level netlist. Calculating the voltage threshold values may further comprise basing the voltage threshold values on the delay timing rules and the static timing analysis. Voltage rails that identify the bulk well voltages required for each of the plurality of gates may be incremented.

The library of performance verification test cases can be predetermined by investigating critical circuit paths from a dynamic timing analysis and a static timing analysis. Each of the performance verification test cases is performed for a separately controlled section of the plurality of circuits. The method may further comprise generating a correlation table of the circuit activity against the performance verification test cases.

In a second aspect, the present invention is directed to a method of adjusting voltage thresholds for reducing AC test failures during integrated circuit wafer testing, the wafer having a plurality of gates, circuits, and bulk well voltages, the method comprising: generating a gate level netlist for the integrated circuit wafer; performing static timing analyses on the gate level netlist; simulating the gate level netlist against performance verification test cases; generating integrated circuit simulation traces for the plurality of circuits; calculating an expected frequency versus process profile; assigning pass/fail timing criteria for each of the performance verification test cases; exercising the performance verification test cases against the plurality of circuits; correlating circuit failures of the performance verification test cases to the plurality of circuits; analyzing and isolating the circuit failures in the integrated circuit wafer based on the pass/fail timing criteria; calculating a list of voltage threshold shifts corresponding to the bulk well voltages; verifying set-up and hold margins of the plurality of circuits using the list of voltage threshold shifts; obtaining voltage threshold corrections; and, applying the voltage threshold corrections to all sites on the integrated circuit wafer.

In a third aspect, the present invention is directed to a processor based system including a program storage device readable by a machine, tangibly embodying a program of instructions executable by the machine to perform method steps for AC performance tuning by threshold voltage shifting on an integrated circuit wafer having a plurality of gates, circuits, and bulk well voltages, the method steps comprising: analyzing each of the plurality of circuits against a plurality of performance verification test cases; identifying failed circuits that do not pass the plurality of performance verification test cases; calculating voltage threshold values for the failed circuits; performing a static timing analysis on the plurality of circuits, substituting the calculated voltage threshold values for the bulk well voltages; programming the integrated circuit wafer to operate at the calculated voltage threshold values that pass the static timing analysis; and, reanalyzing the plurality of circuits having programmed the calculated voltage threshold values against the plurality of performance verification tests.

The method step of analyzing each of the plurality of circuits further comprises: generating a gate level netlist of the plurality of circuits; and, simulating the netlist on a functional delay simulator against a library of the performance verification test cases and technology circuit delay timing rules.

In a fourth aspect, the present invention is directed to a computer program product comprising: a computer usable medium having computer readable program code means embodied therein for causing AC performance tuning by threshold voltage shifting on an integrated circuit wafer having a plurality of gates, circuits, and bulk well voltages, the computer readable program code means in the computer program product comprising: computer readable program code means for causing a computer to effect analyzing each of the plurality of circuits against a plurality of performance verification test cases; computer readable program code means for causing a computer to effect identifying failed circuits that do not pass the plurality of performance verification test cases; computer readable program code means for causing a computer to effect calculating voltage threshold values for the failed circuits; computer readable program code means for causing a computer to effect performing a static timing analysis on the plurality of circuits, substituting the calculated voltage threshold values for the bulk well voltages; computer readable program code means for causing a computer to effect programming the integrated circuit wafer to operate at the calculated voltage threshold values that pass the static timing analysis; and, computer readable program code means for causing a computer to effect reanalyzing the plurality of circuits having programmed the calculated voltage threshold values against the plurality of performance verification tests.

In a fifth aspect, the present invention is directed to a computer program product comprising: a computer usable medium having computer readable program code means embodied therein for causing AC performance tuning by threshold voltage shifting on an integrated circuit wafer having a plurality of gates, circuits, and bulk well voltages, the computer readable program code means in the computer program product comprising: computer readable program code means for causing a computer to effect generating a gate level netlist for the integrated circuit wafer; computer readable program code means for causing a computer to effect performing static timing analyses on the gate level netlist; computer readable program code means for causing a computer to effect simulating the gate level netlist against performance verification test cases; computer readable program code means for causing a computer to effect generating integrated circuit simulation traces for the plurality of circuits; computer readable program code means for causing a computer to effect calculating an expected frequency versus process profile; computer readable program code means for causing a computer to effect assigning pass/fail timing criteria for each of the performance verification test cases; computer readable program code means for causing a computer to effect exercising the performance verification test cases against the plurality of circuits; computer readable program code means for causing a computer to effect correlating circuit failures of the performance verification test cases to the plurality of circuits; computer readable program code means for causing a computer to effect analyzing and isolating the circuit failures in the integrated circuit wafer based on the pass/fail timing criteria; computer readable program code means for causing a computer to effect calculating a list of voltage threshold shifts corresponding to the bulk well voltages; computer readable program code means for causing a computer to effect verifying set-up and hold margins of the plurality of circuits using the list of voltage threshold shifts; computer readable program code means for causing a computer to effect obtaining voltage threshold corrections; and, computer readable program code means for causing a computer to effect applying the voltage threshold corrections to all sites on the integrated circuit wafer.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
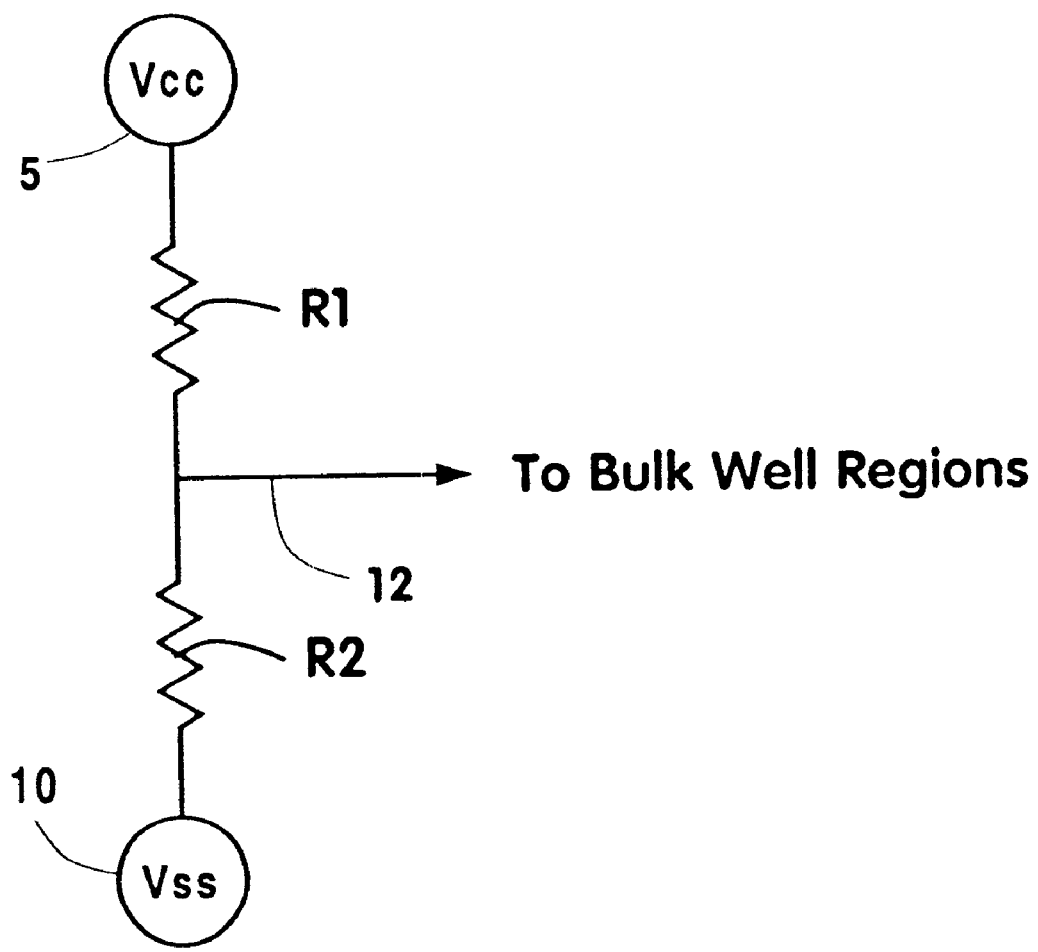
FIG. 1 is an electrical schematic of a prior art bulk voltage connection made at the connection point between two series resistors bridging the $V_{CC}$ to $V_{SS}$ envelope.
Figure 2:
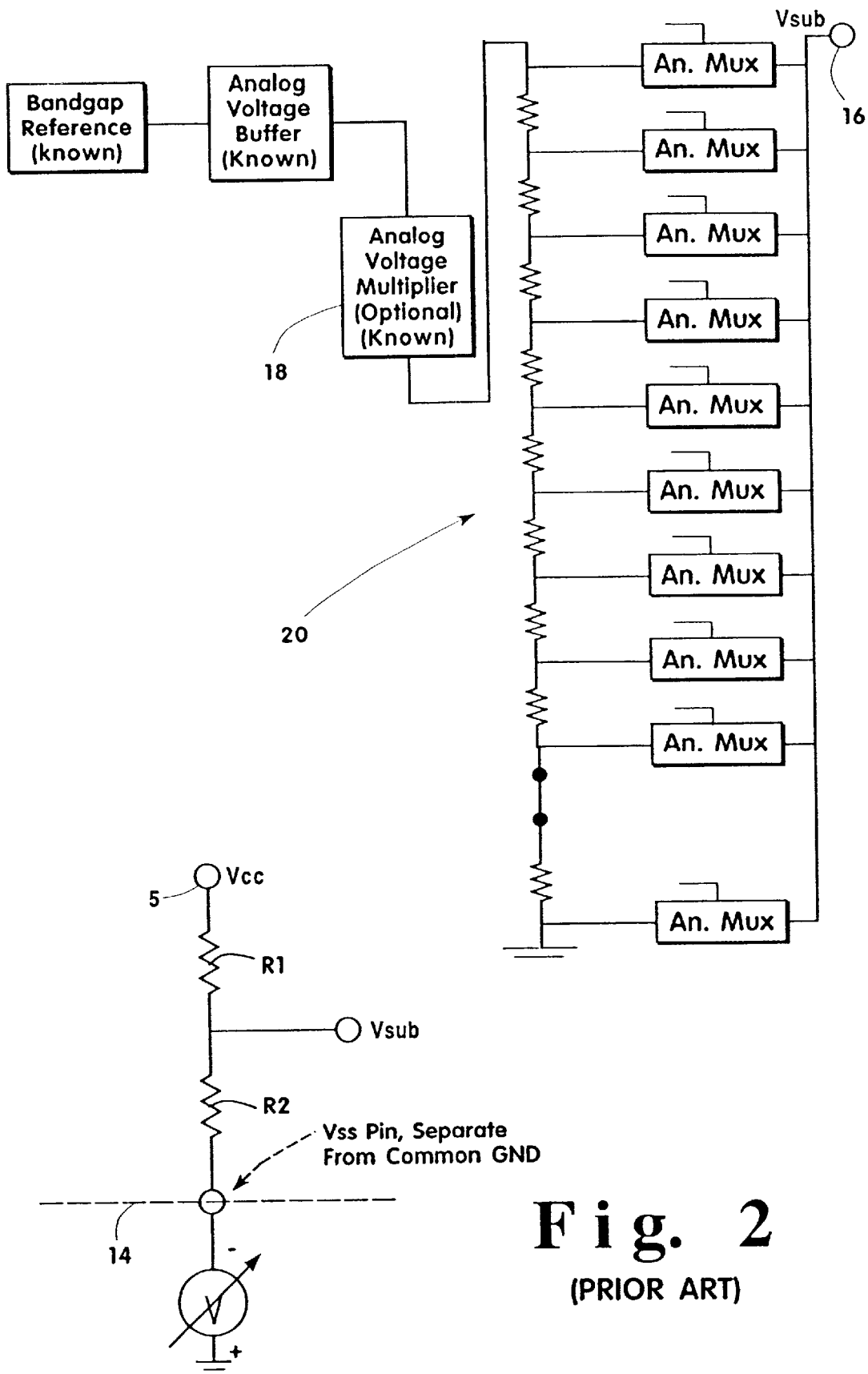
FIG. 2 is an electrical schematic of a prior art potentiometer delivering the $V_{cc}$ via a bandgap reference system.
Figure 3:
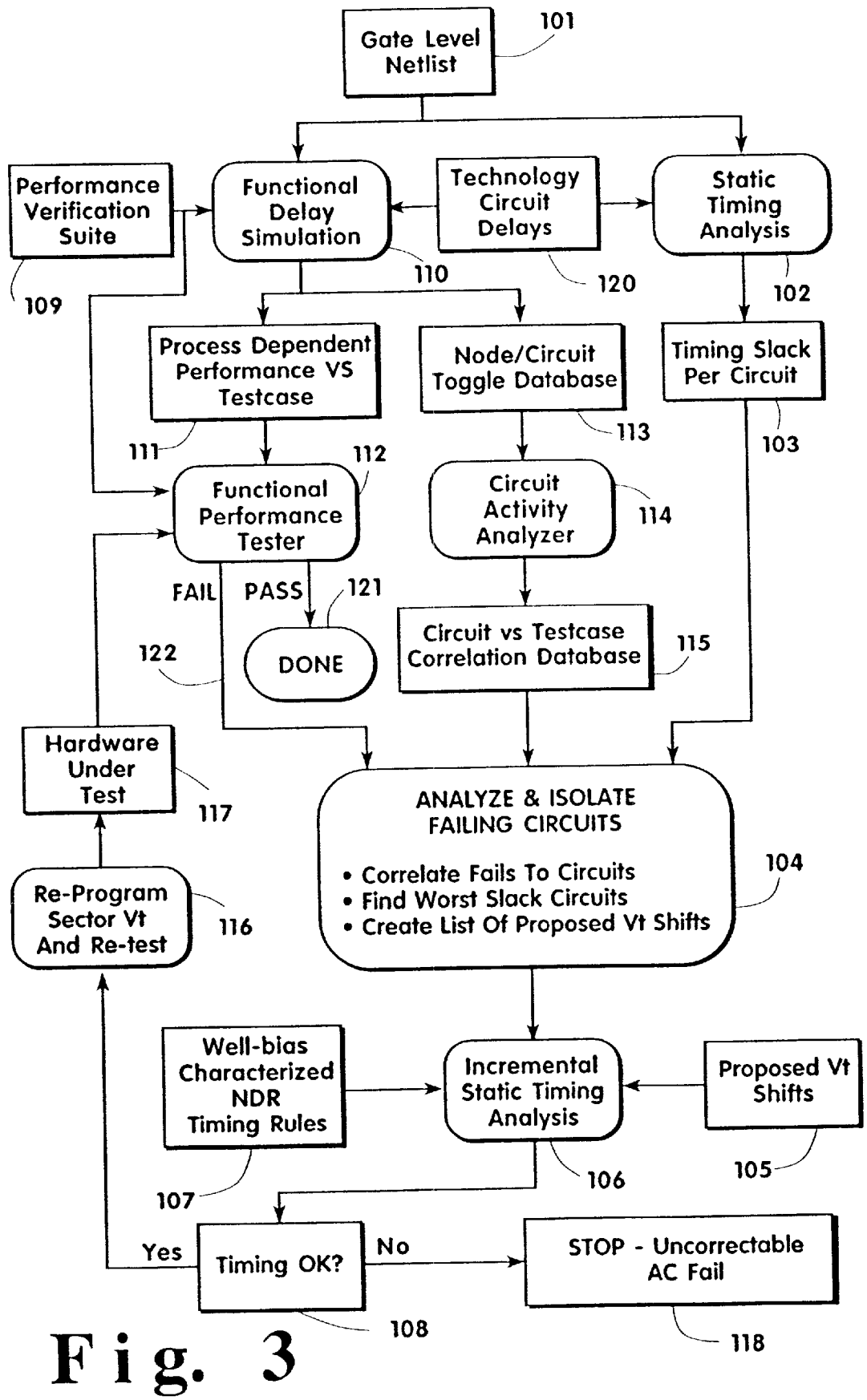
FIG. 3 is a flowchart of the present invention for implementing $V_T$ shifts for AC performance enhancements.

In describing the preferred embodiment of the present invention, reference will be made herein to FIGS. 1–4 of the drawings in which like numerals refer to like features of the invention. Features of the invention are not necessarily shown to scale in the drawings.

A system and method are described for separating the bulk connections for FETs on the die from the supply rails, testing the die to determine if a shift in the threshold voltage, $V_T$, of certain devices within the die (as defined by the wells) can remove an AC defect, and tailoring the voltage or voltages applied to the bulk nodes, post-manufacture, such that the integrated circuit meets its performance targets or may be sorted to a more valuable performance level. While the present invention is useful in all FET based integrated circuits, its utility is increased with increases in the number of device wells that may be independently biased, such as in advanced CMOS processes.

In all prior art embodiments for altering the bias voltage, independent coupling of the wells to an adjustable bias source allows for independent biasing of n-FETs, p-FETs or both n-FETs and p-FETs depending upon on the technology attributes. As above, most base technologies force well potentials to either $V_{DD}$ (for p-FETs) or Ground (for n-FETs). Reduction in p-FET back bias or increase in n-FET back bias by the disclosed method will increase the relative $V_T$ of the device, thereby slowing the device down. While this seems counter to healing AC failures, those failures associated with a particular transition, either rising or falling, may be corrected if the performance of the devices responsible for complimentary drive is slowed so as to reduce cross-through current and allow for more current from the slow devices to do the work of charging the sink capacitance. As the $V_{SS}$ and $V_{CC}$ nodes of the biasing stack are freed from the $V_{DD}$ and Ground of the die, it is possible to extend the biasing envelope beyond the $V_{DD}$ to Ground window, thereby increasing the performance of the affected device beyond that afforded by rail connection. However, extension of the envelope must be limited in order to maintain ample back bias for sensitive devices and bulk-well junction diodes in order to prevent increased leakage currents and latch-up. In order to take full advantage of the approximately 100 mV of envelope extension possible, a selection matrix should provide for tapping of the biasing rails either by selective analog muxtiplexing or by adding shunt transistors to the tap node.

In determining possible $V_T$ shifts for performance enhancement, a data base is proposed to contain a set of AC performance tests, where each test identifies and represents a domain of related circuitry. By running a plurality of tests, a region of active circuits are isolated, having the highest probability of causing an AC performance failure. These active circuits are then targeted for possible $V_T$ shifting. Before implementing the proposed $V_T$ shifts in hardware, however, static timing analyses are conducted to validate the $V_T$ shifts in order to ensure that setup and hold violations are not introduced. The methodology of the present invention, implementing $V_T$ shifts for AC performance enhancements, is outlined in the flowchart of FIG. 3.

The methodology begins with generating a gate level netlist 101 depicting the circuit networks of the IC, where initially all bulk wells have been pre-conditioned using nominal bias. The gate level netlist 101 represents an array of circuit nodes for each circuit on the IC, and is typically stored and manipulated by a processor based system for easy retrieval and analysis. Nominal bias is chosen for the initial bias condition as a trade off between timing performance and power dissipation due to leakage currents. The netlist 101 is simulated on a functional delay simulator 110, such as the Cadence VarilogXL with back-annotated Physical Design delays, and the like, against a library of performance verification test cases or suite 109. Technology circuit delay timing information 120 is inputted to the functional delay simulator 110. It is recommended that at least as many tests be developed as there are separately controlled sections of circuits, but a larger number of tests allows the user to isolate the failing circuits more expediently by cross-checking the failing tests against a database of circuit changes per test. These test cases form the performance verification suite 109, that, if run against the hardware on a functional AC performance tester 112 at the required frequency, guarantees that the device will properly operate at that frequency. The performance verification library or suite 109 is obtained by analytically considering critical paths from static and/or dynamic timing analyses and generating test cases which would specifically sensitize them within the circuit network. For every test case in the performance suite 109, an expected frequency versus process profile relationship 111 is obtained that indicates the expected pass/fail timing for that particular test function, process, or delay mode. This pass/fail data is available upon completion of the functional performance test and outputted as a result. The performance tests consider worst-case, nominal, and best case conditions. If the analysis passes 121 the functional performance test, then the method is complete and no further analysis is necessary. If however, the functional performance test fails the given circuit under consideration 122, further analyses are required.

The functional delay simulation step 110 is used to generate simulation traces which are essentially a database of node or circuit toggles per test 113. By keeping track of which nodes toggle in each performance test, it is possible to analyze the circuit activity 114 to create a correlation database of active circuits versus performance tests 115. In order to optimally isolate failing circuits, the performance verification suite 109 should include as many orthogonal test cases as possible, which would facilitate locating specific circuits. However, since test case orthogonality is not always possible, it is often necessary to apply an algorithm 104 which correlates the failing test cases against the test case correlation database 115, resulting in the most likely circuits that will solve the performance failure if a $V_T$ shift is applied. This algorithm 104 may be performed by a processor based system adaptable to the test equipment. The algorithm 104 is used to identify the worst case slack circuits. A list of proposed $V_T$ shifts is then developed for further empirical tests.

When the algorithm 104 identifies a circuit or circuits as being responsible for an AC failure, the fast-path margins contained in an initial timing slack report 103 are consulted to ensure the circuit is not sped up more than allowed, thereby causing an AC timing violation. The timing slack report 103 is generated from a static timing analyzer 102, such as an EinsTimer, and the like, using as inputted information the gate level netlist 101 and technology circuit timing delay information 120. The gate based timing rule used by the static timing analyzer is required to support timing as a function of bulk biasing. Although different timing rules may be implemented, the preferred EinsTimer typically uses New Delay Rules (NDRs) as the timing rule for predicting circuit performance. For each adjustable bulk well voltage unique to gate performance, the NDRs would simply increment the number of voltage rails required by that gate. Gate characterization based on each new voltage rail would then be required during the NDR generation process. The static timing analyzer 102 would treat these voltage rails which identify bulk well voltages, as voltage islands that could be controlled independently during further tests.

Using the initial timing slack report 103, the test case correlation database 115, and the results of the functional performance tester 112 for the failed AC tests, the algorithm 104 generates a list of proposed $V_T$ shifts 105 that identifies the voltage islands corresponding to the bulk well voltages and their values. The proposed $V_T$ shifts 105 are used by an incremental static timing analyzer 106 along with the bulk well bias characterized NDR timing rules 107 to verify setup and hold slack margins. If no violations are detected, the initial slack report 103 may be updated. If the timing analysis is acceptable 108, the proposed $V_T$ shifts 105 are reprogrammed 116 into the hardware 117 for retest. If, after incremental static timing analysis, no favorable timing results can be achieved, then the methodology is terminated 118, as no correctable AC failures are found to exist.

For acceptable timing results, the hardware 117 is re-verified in the functional AC tester 112, completing an iterative loop. The methodology is iterative in order to allow for incrementally small $V_T$ adjustments to selected circuits. Each incremental shift is measured and the benefit or detriment assessed. This ensures the minimum amount of correction is made to the hardware. Preferably, the test is applied on a single site of a wafer until all the $V_T$ corrections are determined for the wafer. Once the $V_T$ corrections are obtained for a single site, they may be applied to all the other sites on the wafer, after which time the performance tests are used as a simple performance screen.

Figure 4:
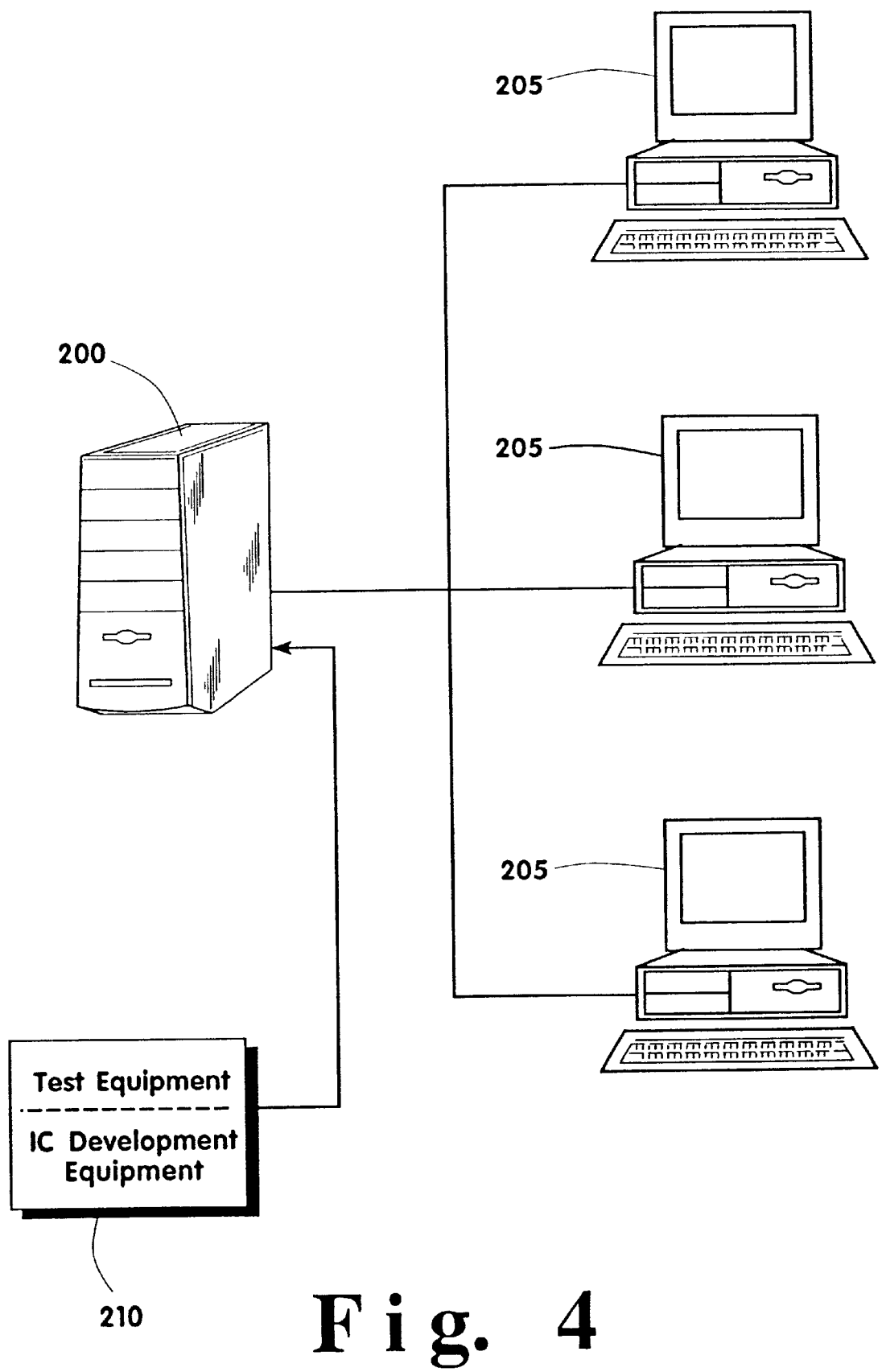
FIG. 4 is a block diagram of a processor-based system capable of carrying out the method for AC performance tuning by threshold voltage shifting

A processor based system is preferably used to perform the methodology of the instant invention. This system must interface directly with the test equipment operating and measuring the integrated circuit wafer under test. FIG. 4 depicts a block diagram of a processor system capable of carrying out the method for AC performance tuning by threshold voltage shifting. The architecture generally consists of a microprocessor based engine 200 interfacing with I/O terminals 205 and test equipment 210. The test equipment may incorporate the fabrication equipment for integrated circuit wafer development, or simply interface to it. The test equipment may include the static timing analyzer, the functional performance tester, and reprogramming capability to the hardware under test. Once the methodology is programmed using processor 200, the threshold voltage shifting test becomes automated and requires no further user intervention, although it continuously remains accessible to the user. The processor then controls the test equipment, performs the calculations on the netlist, integrates the delay timing rules, performs the functional delay simulation, stores and utilizes the performance verification test cases, correlates failures to certain circuits, finds worst case slack circuits, and creates a list of proposed threshold voltage shifts. Through this automated test system, the hardware under test is reprogrammed with the new threshold voltage shifts and re-tested against the performance test suite.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for reducing AC test failures during performance testing of an integrated circuit wafer having a plurality of gates, circuits, and bulk well voltages, said method comprising:
    analyzing each of said plurality of circuits against a plurality of performance verification test cases;
    identifying failed circuits that do not pass said plurality of performance verification test cases;
    calculating voltage threshold values for said failed circuits;
    performing a static timing analysis on said plurality of circuits, substituting said calculated voltage threshold values for said bulk well voltages;
    programming said integrated circuit wafer to operate at said calculated voltage threshold values that pass said static timing analysis; and,
    reanalyzing said plurality of circuits having programmed said calculated voltage threshold values against said plurality of performance verification tests.

2. The method of claim 1 wherein said analyzing each of said plurality of circuits further comprises:
    generating a gate level netlist of said plurality of circuits; and,
    simulating said netlist on a functional delay simulator against a library of said performance verification test cases and technology circuit delay timing rules.

3. The method of claim 1 wherein said bulk well voltages are initially preconditioned using nominal bias values.

4. The method of claim 3 wherein said nominal bias values are chosen such that there is a trade off between timing performance and power dissipation due to leakage currents.

5. The method of claim 2 wherein performing said static timing analysis further comprises analyzing said gate level netlist.

6. The method of claim 2 wherein calculating said voltage threshold values further comprises basing said voltage threshold values on said delay timing rules and said static timing analysis.

7. The method of claim 6 further comprising incrementing voltage rails that identify said bulk well voltages required for each of said plurality of gates.

8. The method of claim 7 further comprising characterizing said plurality of gates based on said incremental voltage rails required by said delay timing rules.

9. The method of claim 2 wherein said library of performance verification test cases is predetermined by investigating critical circuit paths from a dynamic timing analysis and a static timing analysis.

10. The method of claim 1 wherein each of said performance verification test cases is performed for a separately controlled section of said plurality of circuits.

11. The method of claim 1 further comprising generating a plurality of nodes or circuit toggles as a function of each of said performance verification test cases.

12. The method of claim 11 further comprising analyzing circuit activity by logging said plurality of circuit toggles during each of said performance verification test cases.

13. The method of claim 12 further comprising generating a correlation table of said circuit activity against said performance verification test cases.

14. A method of adjusting voltage thresholds for reducing AC test failures during integrated circuit wafer testing, said wafer having a plurality of gates, circuits, and bulk well voltages, said method comprising:

generating a gate level netlist for said integrated circuit wafer;

performing static timing analyses on said gate level netlist;

simulating said gate level netlist against performance verification test cases;

generating integrated circuit simulation traces for said plurality of circuits;

calculating an expected frequency versus process profile;

assigning pass/fail timing criteria for each of said performance verification test cases;

exercising said performance verification test cases against said plurality of circuits;

correlating circuit failures of said performance verification test cases to said plurality of circuits;

analyzing and isolating said circuit failures in said integrated circuit wafer based on said pass/fail timing criteria;

calculating a list of voltage threshold shifts corresponding to said bulk well voltages;

verifying set-up and hold margins of said plurality of circuits using said list of voltage threshold shifts;

obtaining voltage threshold corrections; and, applying said voltage threshold corrections to all sites on said integrated circuit wafer.

15. The method of claim 14 wherein said bulk well voltages are initially preconditioned using nominal bias values.

16. The method of claim 15 wherein said nominal bias values are chosen such that there is a trade off between timing performance and power dissipation due to leakage currents.

17. The method of claim 14 wherein said static timing analyses are performed on a static analyzer.

18. The method of claim 14 wherein performing said static timing analyses on said gate level netlist further comprises incorporating technology circuit delay timing rules.

19. The method of claim 18 wherein said timing rules support timing as a function of said bulk well voltage biasing.

20. The method of claim 18 further comprising incrementing voltage rails that identify said bulk well voltages required for each of said gates.

21. The method of claim 14 further comprising generating said performance verification test cases by investigating critical circuit paths from said static timing analyses and dynamic timing analyses.

22. The method of claim 14 wherein each of said performance verification test cases is performed for a separately controlled section of said plurality of circuits.

23. The method of claim 14 further comprising generating a plurality of nodes or circuit toggles as a function of each of said performance verification test cases.

24. The method of claim 23 further comprising analyzing circuit activity by logging said plurality of circuit toggles during each of said performance verification test cases.

25. The method of claim 24 further comprising generating a correlation table of said circuit activity against said performance verification test cases.

26. The method of claim 14 wherein correlating said circuit failures further comprises generating a correlation database and an initial timing slack report for each failed test to find worst case slack circuits.

27. The method of claim 26 wherein verifying said set-up and hold margins further comprises updating said initial timing slack report when no fail is detected, and ceasing operation when said fail is detected.

28. The method of claim 27 wherein verifying said set-up and hold margins further comprises reverifying hardware for functional performance.

29. The method of claim 14 further comprising applying said method to a single site in said wafer and adjusting said threshold voltages until all of said threshold voltages are corrected.

30. The method of claim 29 further comprising applying said method to all other sites on said wafer.

31. A processor based system including a program storage device readable by a machine, tangibly embodying a program of instructions executable by the machine to perform method steps for AC performance tuning by threshold voltage shifting on an integrated circuit wafer having a plurality of gates, circuits, and bulk well voltages, said method steps comprising:

analyzing each of said plurality of circuits against a plurality of performance verification test cases;

identifying failed circuits that do not pass said plurality of performance verification test cases;

calculating voltage threshold values for said failed circuits;

performing a static timing analysis on said plurality of circuits, substituting said calculated voltage threshold values for said bulk well voltages;

programming said integrated circuit wafer to operate at said calculated voltage threshold values that pass said static timing analysis; and, reanalyzing said plurality of circuits having programmed said calculated voltage threshold values against said plurality of performance verification tests.

32. The system of claim 31 wherein said method step of analyzing each of said plurality of circuits further comprises:

generating a gate level netlist of said plurality of circuits; and, simulating said netlist on a functional delay simulator against a library of said performance verification test cases and technology circuit delay timing rules.

33. The system of claim 31 wherein said bulk well voltages are initially preconditioned using nominal bias values.

34. The system of claim 32 wherein said method step of performing said static timing analysis further comprises analyzing said gate level netlist.

35. The system of claim 32 wherein said method step of calculating said voltage threshold values further comprises basing said voltage threshold values on said delay timing rules and said static timing analysis.

36. The system of claim 32 wherein said library of performance verification test cases is predetermined by investigating critical circuit paths from a dynamic timing analysis and a static timing analysis.

37. The system of claim 31 wherein each of said performance verification test cases is performed for a separately controlled section of said plurality of circuits.

38. A computer program product comprising: a computer usable medium having computer readable program code means embodied therein for causing AC performance tuning by threshold voltage shifting on an integrated circuit wafer having a plurality of gates, circuits, and bulk well voltages, the computer readable program code means in said computer program product comprising:

computer readable program code means for causing a computer to effect analyzing each of said plurality of circuits against a plurality of performance verification test cases;

computer readable program code means for causing a computer to effect identifying failed circuits that do not pass said plurality of performance verification test cases;

computer readable program code means for causing a computer to effect calculating voltage threshold values for said failed circuits;

computer readable program code means for causing a computer to effect performing a static timing analysis on said plurality of circuits, substituting said calculated voltage threshold values for said bulk well voltages;

computer readable program code means for causing a computer to effect programming said integrated circuit wafer to operate at said calculated voltage threshold values that pass said static timing analysis; and, computer readable program code means for causing a computer to effect reanalyzing said plurality of circuits having programmed said calculated voltage threshold values against said plurality of performance verification tests.

39. A computer program product comprising: a computer usable medium having computer readable program code means embodied therein for causing AC performance tuning by threshold voltage shifting on an integrated circuit wafer having a plurality of gates, circuits, and bulk well voltages, the computer readable program code means in said computer program product comprising:

computer readable program code means for causing a computer to effect generating a gate level netlist for said integrated circuit wafer;

computer readable program code means for causing a computer to effect performing static timing analyses on said gate level netlist;

computer readable program code means for causing a computer to effect simulating said gate level netlist against performance verification test cases;

computer readable program code means for causing a computer to effect generating integrated circuit simulation traces for said plurality of circuits;

computer readable program code means for causing a computer to effect calculating an expected frequency versus process profile;

computer readable program code means for causing a computer to effect assigning pass/fail timing criteria for each of said performance verification test cases;

computer readable program code means for causing a computer to effect exercising said performance verification test cases against said plurality of circuits;

computer readable program code means for causing a computer to effect correlating circuit failures of said performance verification test cases to said plurality of circuits;

computer readable program code means for causing a computer to effect analyzing and isolating said circuit failures in said integrated circuit wafer based on said pass/fail timing criteria;

computer readable program code means for causing a computer to effect calculating a list of voltage threshold shifts corresponding to said bulk well voltages;

computer readable program code means for causing a computer to effect verifying set-up and hold margins of said plurality of circuits using said list of voltage threshold shifts;

computer readable program code means for causing a computer to effect obtaining voltage threshold corrections; and, computer readable program code means for causing a computer to effect applying said voltage threshold corrections to all sites on said integrated circuit wafer.

* * * * *